(12) United States Patent
Ning et al.

(10) Patent No.: US 10,510,784 B2
(45) Date of Patent: Dec. 17, 2019

(54) ARRAY SUBSTRATE AND METHOD OF MANUFACTURING THE SAME, AND DISPLAY APPARATUS

(71) Applicant: BOE Technology Group Co., Ltd., Beijing (CN)

(72) Inventors: Ce Ning, Beijing (CN); Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/110,416

(22) PCT Filed: Oct. 13, 2015

(86) PCT No.: PCT/CN2015/091822
§ 371 (c)(1),
(2) Date: Jul. 8, 2016

(87) PCT Pub. No.: WO2016/192264
PCT Pub. Date: Dec. 8, 2016

(65) Prior Publication Data
US 2017/0148820 A1 May 25, 2017

(30) Foreign Application Priority Data
Jun. 3, 2015 (CN) .......................... 2015 1 0300781

(51) Int. Cl.
*H01L 29/66* (2006.01)
*H01L 27/12* (2006.01)
(Continued)

(52) U.S. Cl.
CPC ............ *H01L 27/127* (2013.01); *H01L 21/28* (2013.01); *H01L 21/30* (2013.01);
(Continued)

(58) Field of Classification Search
USPC ......................................................... 435/155
See application file for complete search history.

(56) References Cited

U.S. PATENT DOCUMENTS

| 8,319,928 B2 | 11/2012 | Nagano et al. |
| 9,240,562 B2 | 1/2016 | Zhang |

(Continued)

FOREIGN PATENT DOCUMENTS

| CN | 102629664 A | 8/2012 |
| CN | 102655154 A | 9/2012 |

(Continued)

OTHER PUBLICATIONS

First Office Action for Chinese Patent Application No. 201510300781.0, dated May 2, 2017, 12 pages.

(Continued)

*Primary Examiner* — Timor Karimy
(74) *Attorney, Agent, or Firm* — Westman, Champlin & Koehler, P.A.

(57) ABSTRACT

The present disclosure provides an array substrate and a method of manufacturing the same and a display apparatus in which the array substrate is applied. In one embodiment, the method of manufacturing an array substrate at least includes the steps of: forming a first electrode layer, a metal gate layer and a first layer of non-oxide insulation material, the first layer of non-oxide insulation material being formed on an upper surface of the metal gate layer; forming, by using one patterning process, a pattern including a first electrode and a gate such that, after completion of the patterning process, a first non-oxide insulation layer is further formed on the gate and a first sub-electrode belonging to the first electrode layer is further formed below the gate. This method of manufacturing the array substrate is (Continued)

simple, which facilitates mass production of the array substrate as well as the display apparatus.

14 Claims, 3 Drawing Sheets

(51) Int. Cl.
*H01L 21/28* (2006.01)
*H01L 21/84* (2006.01)
*H01L 21/30* (2006.01)
*H01L 21/768* (2006.01)
*H01L 29/786* (2006.01)
*H01L 29/417* (2006.01)
*H01L 29/45* (2006.01)
*H01L 29/49* (2006.01)

(52) U.S. Cl.
CPC ........ *H01L 21/76895* (2013.01); *H01L 21/84* (2013.01); *H01L 27/124* (2013.01); *H01L 27/1225* (2013.01); *H01L 27/1248* (2013.01); *H01L 29/41733* (2013.01); *H01L 29/45* (2013.01); *H01L 29/458* (2013.01); *H01L 29/4908* (2013.01); *H01L 29/6675* (2013.01); *H01L 29/66969* (2013.01); *H01L 29/78663* (2013.01); *H01L 29/78672* (2013.01); *H01L 29/78684* (2013.01)

(56) References Cited

U.S. PATENT DOCUMENTS

| | | |
|---|---|---|
| 2004/0125253 A1 | 7/2004 | Kim et al. |
| 2005/0242401 A1* | 11/2005 | Cho .................. G02F 1/136227 257/368 |
| 2007/0269937 A1 | 11/2007 | Lin |
| 2013/0299817 A1* | 11/2013 | Park ........................ H01L 29/45 257/43 |
| 2014/0084264 A1 | 3/2014 | Lee |

FOREIGN PATENT DOCUMENTS

| | | |
|---|---|---|
| CN | 103022056 A | 4/2013 |
| CN | 103545252 A | 1/2014 |
| CN | 104851894 A | 8/2015 |
| JP | 2009-192932 A | 8/2009 |

OTHER PUBLICATIONS

International Search Report and Written Opinion for International Application No. PCT/CN2015/091822, dated Mar. 8, 2016, 10 pages.

English translation of Box No. V of the Written Opinion for the International Searching Authority for International Application No. PCT/CN2015/091822, 2 pages.

* cited by examiner

ARRAY SUBSTRATE AND METHOD OF MANUFACTURING THE SAME, AND DISPLAY APPARATUS

CROSS-REFERENCE TO RELATED APPLICATION

This application is a Section 371 National Stage Application of International Application No. PCT/CN2015/091822, filed on Oct. 13, 2015, which claims priority to Chinese Patent Application No. 201510300781.0 filed on Jun. 3, 2015, incorporated herein by reference in their entirety.

BACKGROUND

Technical Field

The present disclosure relates to the field of liquid crystal display technology, and particularly, to an array substrate, a method of manufacturing the same and a display apparatus to which the array substrate is applied.

Description of the Related Art

Liquid crystal display panel usually comprises an array substrate and a color filter substrate. Wherein, the array substrate comprises thin-film transistors, and, the thin-film transistors include amorphous silicon thin-film transistor, polysilicon thin-film transistor, hydrogenated Amorphous Silicon thin-film transistor, and transparent oxide thin-film transistor.

At present, in order to manufacture the abovementioned array substrate, films and patterns are formed layer by layer, which makes the process complicated. For example, in the manufacture of an array substrate for ADS mode liquid crystal display panel, four times of MASK processes are required if the transistor is amorphous silicon thin-film transistor, and, five times of MASK processes are required if the transistor is oxide thin-film transistor, which results in low yield and poor economic efficiency.

SUMMARY

According to one aspect of the present disclosure, there is provided a method of manufacturing an array substrate, and, the method at least comprises steps of: forming a first electrode layer, a metal gate layer and a first layer of non-oxide insulation material, the first layer of non-oxide insulation material being formed on an upper surface of the metal gate layer; forming, by using one patterning process, a pattern including a first electrode and a gate such that, after completion of the patterning process, a first non-oxide insulation layer is further formed on the gate and a first sub-electrode belonging to the first electrode layer is further formed below the gate.

According to another aspect of the present disclosure, there is also provided an array substrate which is manufactured by the method of manufacturing an array substrate according to the abovementioned technical solution.

According to still another aspect of the present disclosure, there is also provided a display apparatus which comprises an array substrate according to the abovementioned technical solution.

DETAILED DESCRIPTION OF THE EMBODIMENTS

In order to provide a more clear understanding of technique solutions of the present disclosure, an array substrate and a method of manufacturing the same, and a display apparatus of the present disclosure will be further described hereinafter in detail and completely with reference to the attached drawings.

According to a first embodiment of the present disclosure, a method of manufacturing an array substrate at least comprises the following steps of:

forming a first electrode layer, a metal gate layer and a first layer of non-oxide insulation material, the first layer of non-oxide insulation material being formed on an upper surface of the metal gate layer.

Figure 1A:
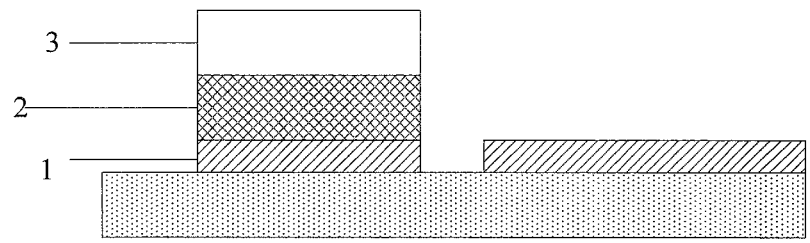
FIG. 1a is a state diagram in which a step of forming, by using one patterning process, a pattern including a first electrode and a gate, of a method of manufacturing an array substrate according to a first embodiment of the present disclosure, has been implemented.

A pattern including a first electrode 1 and a gate 2 is formed by using one patterning process such that, after completion of the patterning process, a first non-oxide insulation layer 3 is formed on an upper surface of the gate 2 and a first sub-electrode 4 belonging to the first electrode layer is further formed below the gate 2. That is to say, the first electrode layer, after the patterning process, is formed with the pattern including the first sub-electrode 4 and the first electrode 1, as shown in FIG. 1*a*.

Specifically, material for the first layer of non-oxide insulation material includes silicon nitride or aluminum nitride; and, material for the metal gate layer and metal source-drain layer includes copper. Due to its relatively high electrical conductivity, as a result, it can facilitate conductions of data signal and scanning signal.

It can be understood that, the method of manufacturing an array substrate according to this embodiment, with the help of the first non-oxide insulation layer 3 formed on the upper surface of the gate 2 that is of oxidizable and conductive material such as copper and the like, prevents a surface of the gate 2 from being oxidized when a subsequent process (e.g., an annealing process for the first electrode 1) is implemented. Hence, by virtue of forming the pattern not only including the first electrode 1 but also including the gate 2 by using one patterning process, one time of patterning process can be at least reduced, which can simplify the process steps and thereby can improve the yield and economic efficiency.

Figure 1B:
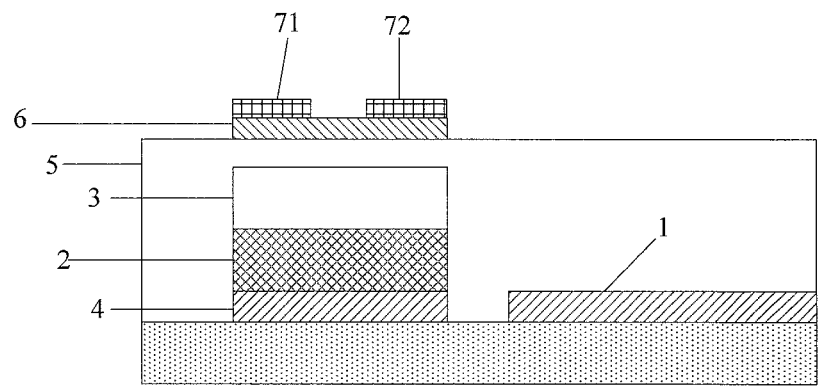
FIG. 1b is a state diagram in which a step of forming correspondingly, by using one patterning process, a pattern including an active layer, a source electrode and a drain electrode, of the method of manufacturing the array substrate according to the first embodiment of the present disclosure, has been implemented.

Specifically, in this embodiment, after the forming, by using one patterning process, the pattern including the first electrode 1 and the gate 2, the method further comprises the following steps of:

forming a third insulation layer 5, forming successively a semiconductor layer and a metal source-drain layer on the third insulation layer 5, and correspondingly, forming, by using one patterning process, a pattern including an active layer 6, a source electrode 71 and a drain electrode 72, as shown in FIG. 1*b*.

Figure 1C:
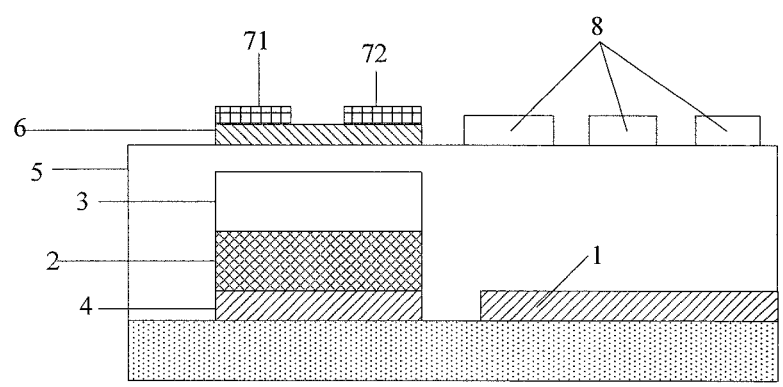
FIG. 1c is a state diagram in which a step of forming correspondingly, by using one patterning process, a pattern including a second electrode, of the method of manufacturing the array substrate according to the first embodiment of the present disclosure, has been implemented.

The method further comprises forming a second electrode layer, and correspondingly, forming, by using one patterning process, a pattern including a second electrode 8. The second electrode 8 is a slit electrode, as shown in FIG. 1*c*.

And, preferably, after the forming the first electrode 1, the method further comprises, implementing an annealing process for the first electrode 1, so that resistance of the first electrode 1 is reduced, which facilitates uniform distribution of a voltage applied on the first electrode 1.

It should be mentioned that, the abovementioned method of manufacturing an array substrate should further comprise a process of forming a via hole for a connection between a scanning line and the gate line 2. Specifically, it not only can be formed at the same time as any one of the abovementioned patterning processes, but also can be formed separately by using one patterning process.

It should be noted that, in this embodiment, the first electrode 1 and the second electrode 8 can respectively be one and the other of a common electrode and a pixel electrode.

In a second embodiment of the present disclosure, there provides a method of manufacturing an array substrate, which is similar to that of the abovementioned first embodiment. The description is omitted for clarity, excepting the following differences between the two. Specifically, in this embodiment, after the forming the first electrode layer, the method further comprises: forming a semiconductor layer; and, further forming a pattern including an active layer 6, while forming the pattern including the first electrode 1 and the gate 2 by using one patterning process.

Figure 2A:
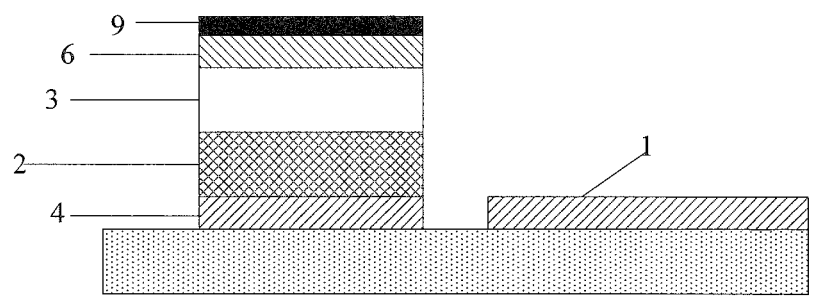
FIG. 2a is a state diagram in which a step of forming, by using one patterning process, a pattern including a first electrode, a gate and an active layer, of a method of manufacturing an array substrate according to a second embodiment of the present disclosure, has been implemented.

From the above, in the method of manufacturing an array substrate according to this embodiment, the pattern including not only the first electrode 1 but also the gate 2 and the active layer 6 can be formed by using one patterning process, as shown in FIG. 2*a*. This can also reduce at least one time of patterning process, which can simplify the process steps and thereby can improve the yield and economic efficiency.

Preferably, an ohmic contact material layer is further formed on the semiconductor layer. After the pattern including the first electrode 1, the gate 2 and the active layer 6 is formed by using one patterning process, an ohmic contact layer 9 is formed on the active layer 6, as shown in FIG. 2*a*, for achieving an ohmic contact between source and drain electrodes 7 and the active layer 6 that is of material such as amorphous silicon, polysilicon, monocrystalline silicon and the like. If the active layer 6 is an oxide semiconductor, an electrical connection between the active layer 6 and the source 71 and drain 72 electrodes is an ohmic contact, here, no ohmic contact layer 9 is required.

Figure 2B:
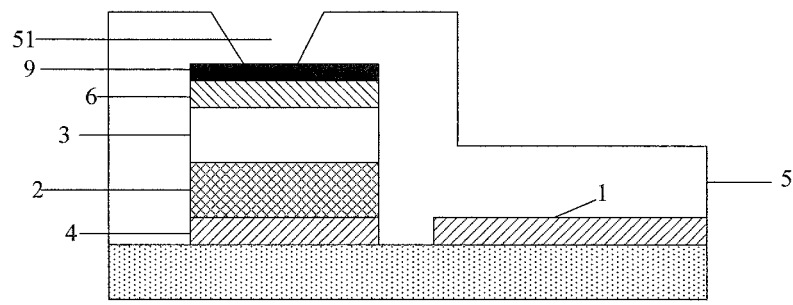
FIG. 2b is a state diagram in which a step of forming, by using one patterning process, a pattern including a via hole, of the method of manufacturing the array substrate according to the second embodiment of the present disclosure, has been implemented.

Preferably, after the forming the pattern including the first electrode, the gate and the active layer by using one patterning process, the method further comprises steps of:

forming a third insulation layer 5, and, forming, by using one patterning process, a pattern including a via hole 51, the via hole 51 being formed at a region that corresponds to the active layer 6 and being served as a channel for an electrical connection between the source and drain electrodes 7 and the active layer 6, as shown in FIG. 2*b*.

Figure 2C:
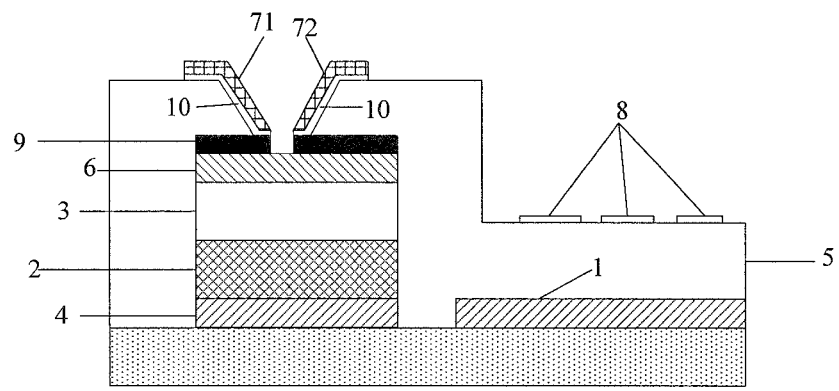
FIG. 2c is a state diagram in which a step of forming simultaneously, by using one patterning process, patterns including a source electrode and a drain electrode and including a second electrode, of the method of manufacturing the array substrate according to the second embodiment of the present disclosure, has been implemented.

The method further comprises forming successively a second electrode layer and a metal source-drain layer on the third insulation layer 5, and, forming, by using one patterning process, patterns including a source electrode 71, a drain electrode 72 and a second electrode 8 such that, after completion of the patterning process, a second sub-electrode 10 positioned below the source and drain electrodes 7 and belonging to the second electrode layer is formed at a position where the via hole 51 is, and the source and drain electrodes 7 are electrically connected to the active layer 6 via the second sub-electrode 10, as shown in FIG. 2*c*.

It can be understood that, the patterns including the source electrode 71, the drain electrode 72 and the second electrode 8 are formed simultaneously by using one patterning process, which further simplifies manufacturing process of the array substrate.

Similarly, the abovementioned method of manufacturing an array substrate should further comprise a process of forming a via hole for a connection between a scanning line and the gate 2. Specifically, it not only can be formed at the same time as any one of the abovementioned patterning processes, but also can be formed separately by using one patterning process. In this embodiment, preferably, the via hole for a connection between a scanning line and the gate 2 is formed while forming a pattern including a via hole 51 in the third insulation layer 5 by using one patterning process.

Figure 2D:
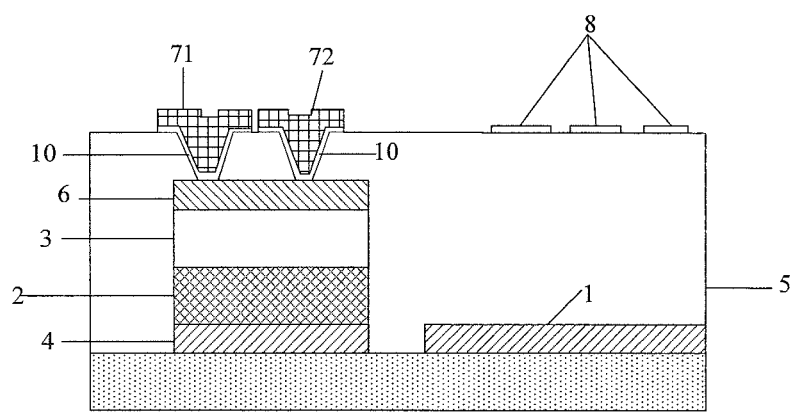
FIG. 2d is another state diagram in which a step of forming simultaneously, by using one patterning process, patterns including a source electrode and a drain electrode and including a second electrode, of the method of manufacturing the array substrate according to the second embodiment of the present disclosure, has been implemented.

It should be noted that, in this embodiment of FIG. 2*b*, only one via hole 51 is disposed at a region, that corresponds to the active layer 6, of the third insulation layer 5, which makes structure of the array substrate simple. However, in practical applications, referring to FIG. 2*d*, via holes 51, which corresponds respectively to the source electrode 71 and the drain electrode 72, can also be disposed at a region, that corresponds to the active layer 6, of the third insulation layer 5, which not only helps on an isolation between the source electrode 71 and the drain electrode 72, but also protects the channels from being etched.

According to a third embodiment of the present disclosure, there provides a method of manufacturing an array substrate, which is similar to those of the abovementioned embodiments. The description is omitted for clarity, excepting the following differences among the three. Specifically, in this embodiment, after the forming the first electrode layer, the method further comprises: forming a metal source-drain layer and a second layer of non-oxide insulation material, the second layer of non-oxide insulation material being formed on an upper surface of the metal source-drain layer. A pattern including an active layer 6, a source electrode 71 and a drain electrode 72 is further formed while forming the pattern including the first electrode 1 and the gate 2 by using one patterning process, such that, after completion of the patterning process, a second non-oxide insulation layer 11 is formed on both the source electrode 71 and the drain electrode 72. It can be understood that, with the help of the second non-oxide insulation layer 11, the source electrode 71 and the drain electrode 72, which are of oxidizable and conductive material such as copper and the like, are prevented from being oxidized during a subsequent process (e.g., an annealing process for the first electrode 1).

Figure 3A:
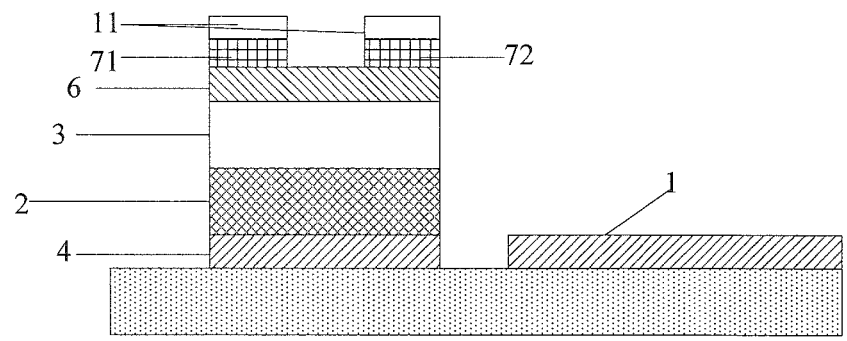
FIG. 3a is a state diagram in which a step of forming, by using one patterning process, a pattern including a first electrode, a gate, an active layer, a source electrode and a drain electrode, of a method of manufacturing an array substrate according to a third embodiment of the present disclosure, has been implemented.

From the above, the method of manufacturing an array substrate according to this embodiment, by virtue of forming the pattern including not only the first electrode 1 but also the gate 2, the active layer 6, the source electrode 71 and the drain electrode 72 by using one patterning process, as shown in FIG. 3a, can also reduce at least one time of patterning process, which can simplify the process steps and thereby can improve the yield and economic efficiency.

Figure 3B:
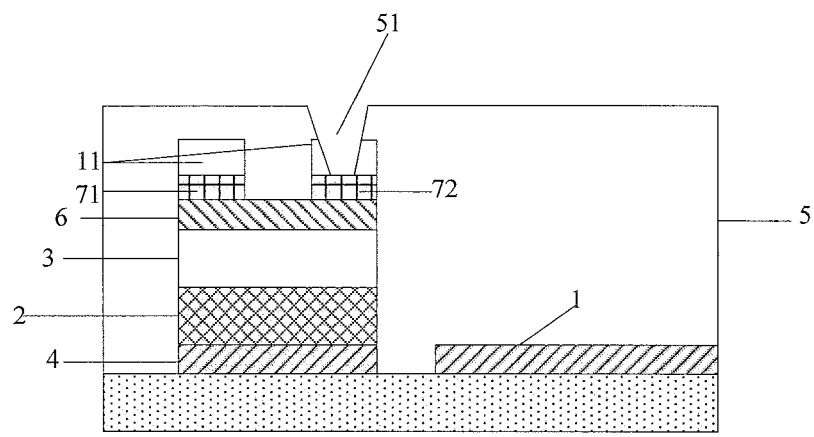
FIG. 3b is a state diagram in which a step of forming, by using one patterning process, a pattern including a via hole, of the method of manufacturing the array substrate according to the third embodiment of the present disclosure, has been implemented.

After the forming the pattern including the first electrode, the gate, the active layer, the source electrode and the drain electrode by using one patterning process, the method further comprises steps of:

forming a third insulation layer 5, and, forming, by using one patterning process, a pattern including a via hole 51, the via hole 51 being formed at a region that corresponds to the drain electrode 72, passing through the third insulation layer 5 and the second non-oxide insulation layer 11, and being served as a channel for an electrical connection between the drain electrode 72 and the second electrode 8, as shown in FIG. 3b.

Figure 3C:
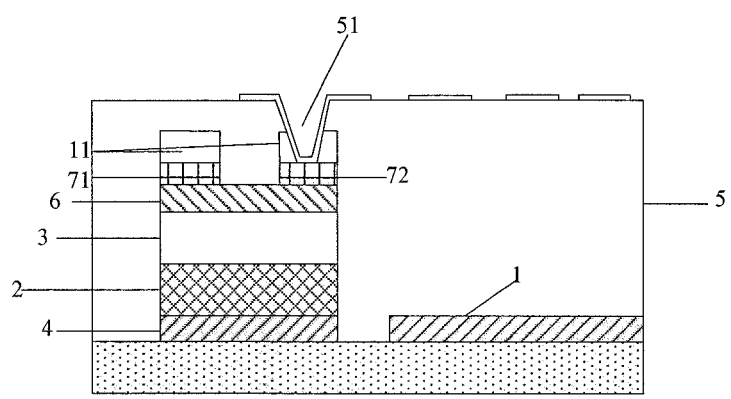
FIG. 3c is a state diagram in which a step of forming, by using one patterning process, a pattern including a second electrode, of the method of manufacturing the array substrate according to the third embodiment of the present disclosure, has been implemented.

The method further comprises forming a second electrode layer on the third insulation layer 5, and, forming, by using one patterning process, a pattern including the second electrode 8, as shown in FIG. 3c.

An array substrate is provided according to an embodiment of the present disclosure. The array substrate is manufactured by the method of manufacturing an array substrate according to any one of the abovementioned first to third embodiments.

The array substrate according to the embodiment of the present disclosure is manufactured by the method of manufacturing an array substrate according to any one of the abovementioned first to third embodiments of the present disclosure. Hence, the manufacturing process is simple, which facilitates mass production of the array substrate and improves economic efficiency.

A display apparatus is further provided according to an embodiment of the present disclosure. The display apparatus comprises an array substrate according to the abovementioned embodiment.

The display apparatus according to the embodiment of the present disclosure adopts an array substrate according to the abovementioned embodiment. The manufacturing process of the array substrate is simple, which facilitates mass production of the array substrate and thereby achieves mass production of the display apparatus and improves economic efficiency.

It should be understood that, the abovementioned embodiments are exemplary ones merely used to illustrate principles of the present invention, but not to limit the present invention. It should be understood by those skilled in the art that, all of changes and modifications, made within principles and spirit of the present invention, should be included within the scope of the present invention.

What is claimed is:

1. A method of manufacturing an array substrate, the method comprising steps of:
    forming a first electrode layer, a metal gate layer and a first layer of non-oxide insulation material, the first layer of non-oxide insulation material being formed on an upper surface of the metal gate layer; and
    forming, by using a first patterning process, patterns including a common electrode and triple layers of a first sub-electrode and a gate and a first non-oxide insulation layer, wherein,
    the common electrode and the first sub-electrode are formed from the first electrode layer and the gate is formed from the metal gate layer, the first non-oxide insulation layer is formed from the first layer of non-oxide insulation material; and
    the gate is formed between the first sub-electrode and the first non-oxide insulation layer, a material for the metal gate layer includes copper or copper alloy; and
    the common electrode is a single layer, and a surface of the common electrode is free of the metal gate layer and the first layer of non-oxide insulation material after completion of the first patterning process.

2. The method according to claim 1, after the step of forming the first layer of non-oxide insulation material, further comprising steps of:
    forming a semiconductor layer; and
    further forming a pattern including an active layer, while forming the pattern including the common electrode and the gate and the first non-oxide insulation layer by using the first patterning process.

3. The method according to claim 2, after the step of forming the pattern including the common electrode, the gate, the first non-oxide insulation layer and the active layer by using the first patterning process, further comprising steps of:
    forming a third insulation layer, and, forming, by using a second patterning process, a pattern including a via hole, the via hole being formed at a region that corresponds to the active layer and being served as a channel for an electrical connection between source and drain electrodes and the active layer; and
    forming successively a second electrode layer and a metal source-drain layer on the third insulation layer, and, forming, by using a third patterning process, patterns including a source electrode, a drain electrode and a pixel electrode such that, after completion of the third patterning process, a second sub-electrode positioned below the source and drain electrodes and belonging to the second electrode layer is formed at a position where the via hole is, and the source and drain electrodes are electrically connected to the active layer via the second sub-electrode.

4. The method according to claim 3, wherein, the pixel electrode comprises a slit electrode.

5. The method according to claim 1, after the step of forming the pattern including the common electrode and the first non-oxide insulation layer and the gate by using the first patterning process, further comprising steps of:
forming a third insulation layer, forming successively a semiconductor layer and a metal source-drain layer on the third insulation layer, and correspondingly, forming, by using a second patterning process, a pattern including an active layer, a source electrode and a drain electrode; and
forming the second electrode layer, and correspondingly, forming, by using a third patterning process, a pattern including the pixel electrode.

6. The method according to claim 5, wherein, the pixel electrode comprises a slit electrode.

7. The method according to claim 1, after the step of forming the common electrode, further comprising a step of implementing an annealing process for the common electrode.

8. An array substrate which is manufactured by the method according to claim 1.

9. A display apparatus, which comprises an array substrate according to claim 8.

10. The method according to claim 1, after the step of forming the first electrode layer, further comprising steps of:
forming a semiconductor layer, a metal source-drain layer and a second layer of non-oxide insulation material, the second layer of non-oxide insulation material being formed on an upper surface of the metal source-drain layer; and
forming a pattern including an active layer, a source electrode and a drain electrode by using the first patterning process, while forming the pattern including the common electrode and the gate and the first non-oxide insulation layer by using the first patterning process, such that, after completion of the first patterning process, the active layer is formed from the semiconductor layer, the source electrode and the drain electrode are formed from the metal source-drain layer, and a second non-oxide insulation layer is formed from the second layer of non-oxide insulation material, wherein, the second non-oxide insulation layer is formed on both the source electrode and the drain electrode.

11. The method according to claim 10, after the step of forming the pattern including the common electrode, the gate, the first non-oxide insulation layer, the active layer, the source electrode and the drain electrode by using the first patterning process, further comprising steps of:
forming a third insulation layer;
forming, by using a second patterning process, a pattern including a via hole, the via hole being formed from the third insulation layer, being formed at a region that corresponds to the drain electrode, passing through the third insulation layer and the second non-oxide insulation layer, and being served as a channel for an electrical connection between the drain electrode and a pixel electrode; and
forming a second electrode layer on the third insulation layer, and, forming, by using a third patterning process, a pattern including the pixel electrode, wherein the pixel electrode is formed from the second electrode layer.

12. The method according to claim 11, wherein, the pixel electrode comprises a slit electrode.

13. The method according to claim 10, wherein a material for the first layer of non-oxide insulation material and the second layer of non-oxide insulation material includes silicon nitride or aluminum nitride.

14. The method according to claim 10, wherein orthographic projections of the source electrode and the drain electrode on the gate are substantially within an orthographic projection of the second non-oxide insulation layer on the gate.

* * * * *